(12) United States Patent
Pitault et al.

(10) Patent No.: US 6,879,165 B2
(45) Date of Patent: Apr. 12, 2005

(54) DETECTOR HAVING REMOTE DIALOGUE FACILITIES

(75) Inventors: Gérard Pitault, Ruelle (FR); Victorio Vedelago, Saint Yrieix (FR)

(73) Assignee: Schneider Electric Industries SAS, Rueil-Malmaison (FR)

(*) Notice: Subject to any disclaimer, the term of this patent is extended or adjusted under 35 U.S.C. 154(b) by 0 days.

(21) Appl. No.: 10/323,648

(22) Filed: Dec. 20, 2002

(65) Prior Publication Data

US 2003/0128132 A1 Jul. 10, 2003

(30) Foreign Application Priority Data

Dec. 26, 2001 (FR) .......................................... 01 17105

(51) Int. Cl.[7] ............................................... G01R 27/02
(52) U.S. Cl. ...................................... 324/609; 324/605
(58) Field of Search ................................ 324/609, 605, 324/699; 361/600; 192/129; 318/650, 86

(56) References Cited

U.S. PATENT DOCUMENTS 6,171,276 B1 * 1/2001 Lippe et al. .................. 604/67
6,388,412 B1 * 5/2002 Reed et al. .................. 318/466

FOREIGN PATENT DOCUMENTS

| DE | 198 42 351 | 7/2000 |
| DE | 100 10 094 | 9/2001 |
| EP | 1 096 608 | 5/2001 |
| EP | 1 143 620 | 10/2001 |

* cited by examiner

*Primary Examiner*—N. Le
*Assistant Examiner*—John Teresinski
(74) *Attorney, Agent, or Firm*—Oblon, Spivak, McClelland, Maier & Neustadt, P.C.

(57) ABSTRACT

A proximity detector having a housing and issuing an output signal whose state is a function of the position of a target or of the frequency of passage of a target, where the detector parameters can be set by an operator using operator dialog facilities communicating with the detector by dialog signals. The dialog facilities are separated from the detector housing and can be incorporated into a connection block connected to the detector housing by a connecting cable which conveys the dialog signals and the detector output signal.

24 Claims, 2 Drawing Sheets

DETECTOR HAVING REMOTE DIALOGUE FACILITIES

BACKGROUND OF THE INVENTION

The present invention relates to a proximity detector of the inductive, capacitive, magnetic or photoelectric type which has remote dialogue facilities in order to enable an operator to carry out, notably, a detector learning function.

Some proximity detectors have a learning mode in order that the range of the detector can be automatically adapted with respect to the surroundings and/or with respect to a target. In fact, the inherent detection range of such an apparatus can vary from one detector to another, and for the same detector can vary according to the environment and assembly conditions, especially for an inductive detector embedded in solid metal. Furthermore, certain applications need the ability to change detector sensitivity according to its use. It is therefore useful to be able to make range learning for a proximity detector take place where it is used. Such a detector is notably described in document EP1143620.

Other proximity detectors are used to monitor rotation. In the same apparatus, they combine the conventional functions of detecting the presence of a target with the functions of counting the information received by the sensor over a given time, in order to compare, for example, with a preset triggering frequency on the apparatus in such a way as to output a signal which is the result of this comparison. In this way, we obtain an apparatus which is suitable for dealing in particular with problems of under-or over-speed with respect to a nominal frequency.

Document EP1130403 describes a detector for monitoring rotation, in front of which passes a target for which we want to monitor the frequency of passage compared to a normal frequency of passage. This detector has operator dialogue facilities consisting of a pushbutton and a dialogue electro-luminescent diode (LED) on the detector. The pushbutton serves to set the detector into a working mode or a learning mode. The learning mode enables the detector micro controller to calibrate the normal frequency of passage and makes it possible to select a detector operating margin about this normal frequency. In the learning mode, the dialogue LED associated with the pushbutton serves, for example, to guide the operator in setting the required detector operating margin.

However, as the size of a proximity detector is often very small, it is difficult to incorporate directly into the product those operator dialogue facilities needed to perform the learning functions. Furthermore, proximity detectors are often placed in an environment which is hostile for human beings, notably when close to moving machinery. Thus any operator manipulation of a pushbutton which is directly mounted on the detector would then be potentially dangerous.

The purpose of the present invention is to overcome these disadvantages by proposing a solution which makes simple installation of the dialogue facilities possible while also guaranteeing operator safety.

SUMMARY OF THE INVENTION

In order to do this, the invention describes a proximity detector comprising a housing and issuing an output signal whose state is a function of the position of a target in front of the said housing or of the frequency of passage of a target in front of the said housing, the detector comprising dialogue facilities communicating with the detector by dialogue signals in order to permit an operator to set the parameters of the detector. According to the invention, the dialogue facilities are separate from the detector housing.

According to one characteristic, the dialogue facilities are incorporated in a connection block connected to the detector housing by a connecting cable which conveys the dialogue signals and the detector output signal. The connection block has an external connection connector for the detector output signal.

According to another characteristic, the dialogue facilities comprise a dialogue LED and pushbutton.

BRIEF DESCRIPTION OF THE DRAWINGS

Other characteristics and advantages will become apparent in the detailed description which follows by referring to one method of production given by way of example and represented by the annexed diagrams in which.

DESCRIPTION OF THE PREFERRED EMBODIMENT

Figure 1:
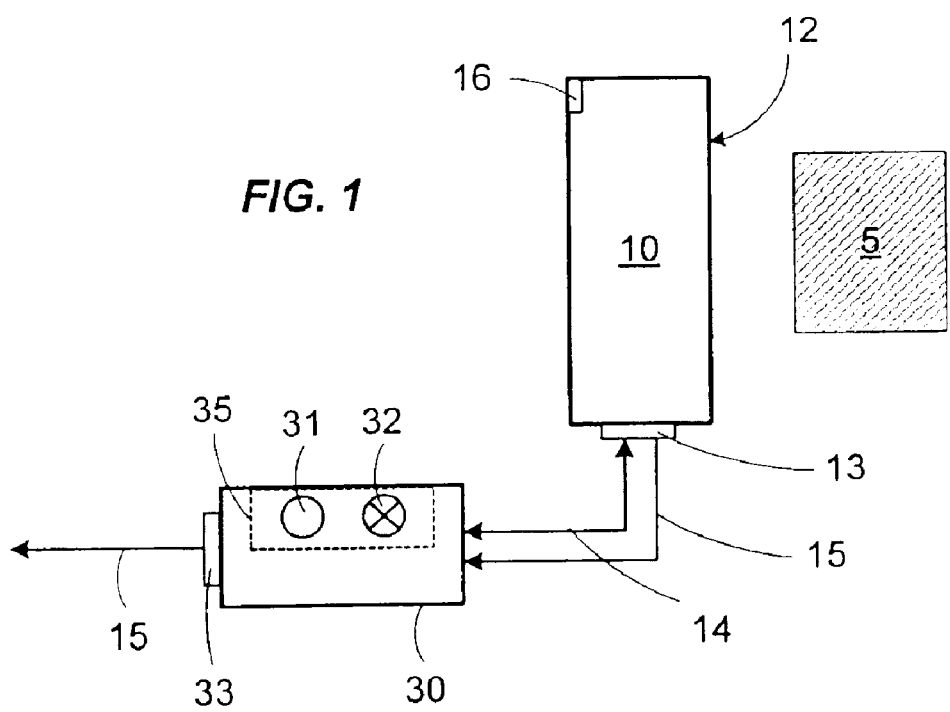
FIG. 1 represents a functional diagram of a proximity detector according to the invention.

With reference to FIG. 1, a detection apparatus has a housing 10, for example of parallelepiped shape, fitted with a detection face 12. This detection apparatus, called "detector" or "proximity detector" in the present document, is an inductive, capacitive, magnetic or photoelectric cell proximity detector. The detector is charged with detecting the presence of one or more targets 5 in front of the detection face 12 of housing 10, in such a way as to issue an output signal 15, generally a binary signal, which is either a direct function of the position of target 5 in front of detection face 12 for use as simple proximity detector, or a function of the frequency of passage of target 5 in front of detection face 12 for use as a rotation monitoring detector. On housing 10, there is frequently placed a signaling LED 16 which, conventionally, is the image of output 15.

As indicated previously, such a detector often includes a learning mode in order to enable an operator to adjust a certain number of parameters, such as, for example, the nominal frequency of passage of the target, the margin of operation or detector sensitivity, the selection of operating mode, etc. These parameters are determined by the operator who uses simple dialogue facilities 35 which are connected to the detector in order to do so. The dialogue facilities enable the operator to read certain information coming from the sensor and also to send information to the sensor. Adjustments may be carried out either during manufacture of the detector, or during its initial installation on site, or when a target 20 is positioned, and also, notably, during periodic maintenance.

In one preferred embodiment, dialogue facilities 35 of the detector include an input organ for sending informations to the detector, like a pushbutton 31, and an output organ for reading informations from the detector, like a dialogue LED 32 (electro-luminescent diode), which communicate with the detector by dialogue signals 14. Thanks to such dialogue facilities, it is then possible at low cost to institute simple adjustment procedures enabling an operator to set the detector parameters in a straightforward manner. It is also possible to envisage replacing pushbutton 31 by a rotary switch, for example.

Usually, these dialogue facilities 35 are positioned directly on the detector housing 10. However, this simple solution sometimes presents problems, especially if the size of the housing 10 is not adapted for an easy installation of the dialogue facilities 35 (detector too small) or when the housing 10 is installed in a location which is dangerous for the operator (machinery surroundings).

For this reason, according to the invention, operator dialogue facilities 35 of the detector are located remote from detector housing 10, in such a way that they are in an area that does not present any danger for an operator.

Advantageously, dialogue facilities 35 are then incorporated into a connection block 30 which is connected to housing 10 by connecting cable 20. The electrical power supply of the dialogue facilities 35 comes from the detector. Thus, the invention describes distributed or remote dialogue facilities of a detector and not external dialogue facilities. One end of this connecting cable 20 is fixed to connection block 30, for example by moulding. According to one preferred embodiment, the connecting cable 20 comprises a total of five conductors or wires in order to convey, on the one hand, dialogue signals 14 which are necessary for communication between dialogue facilities 35 and housing 10 and, on the other hand, the detector output signal 15.

The output signal 15 from a detector is generally conveyed on two or three wires depending on the technology used for the connection (for example, AC/DC type connection in two-wire technology: "signal" and "−", or DC type connection in three-wire technology: "+", "−" and "signal"). For the dialogue facilities composed of pushbutton 31 and a dialogue LED 32, the dialogue signals 14 are then conveyed on either three remaining wires in an AC/DC type connection, or on two remaining wires in a DC type connection. In this latter case, the two wires are used respectively for the signal from the pushbutton and for that from the LED, the common being connected to the "−" wire of the output signal 15.

Connection block 30 also contains a connector for external connection 33 enabling output signal 15 from the detector to be made available on an external cable. This external connector 33 is, for example, of type M12, type K or other type. Equally, external connector 33 might also contain only those terminals onto which an external cable is to be connected in order to retrieve the detector output signal 15.

Connecting cable 20 is sufficiently long so that connection block 30 is no longer situated in the danger zone of housing 10 but is nevertheless able to maintain connection block 30 and detector housing 10 close together. Typically, this length is of the order of five to fifty centimeters, and preferably from ten to twenty centimeters.

Figure 2:
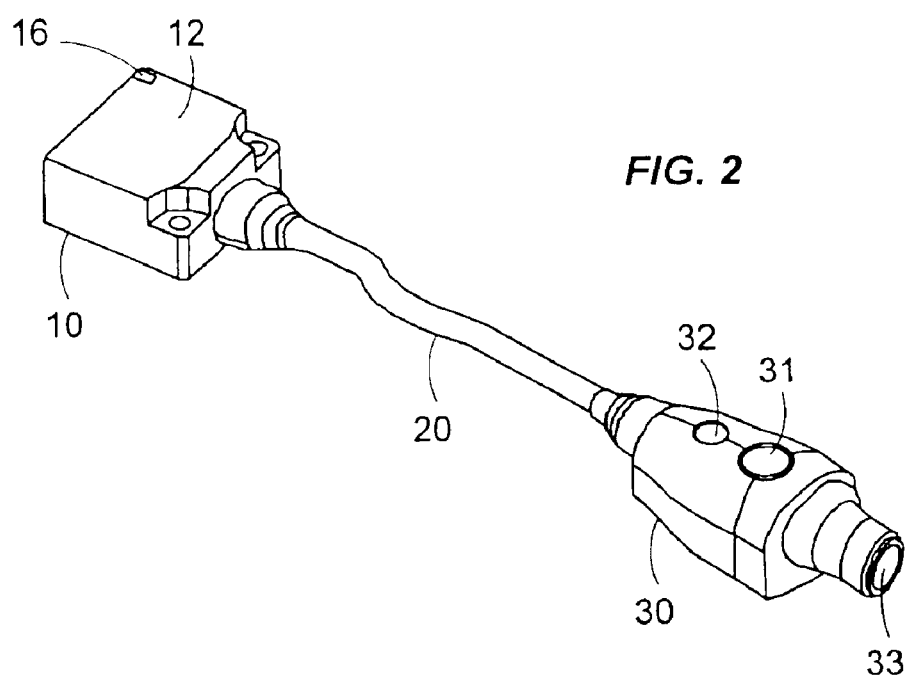
FIG. 2 shows one embodiment of a detector fitted with a connection block.

In a first variant, the other end of connecting cable 20 is directly fixed to detector housing 10. This fixation is advantageously realized by moulding of connecting cable 20 on housing 10. In this way, as shown in FIG. 2, each detector has systematically a connection block 30 which is fitted with dialogue facilities 35 for setting the detector parameters, and an external connector 33 for delivering output signal 15 from the detector.

In a second variant, detector housing 10 has a connector for internal connection 13. This internal connector 13 makes it possible to connect and disconnect the other end of connecting cable 20 which is fitted with a connector that can mate with internal connector 13. Advantageously, internal connector 13 and external connector 33 are of the same type so that an external connecting cable connected to one of the connectors 13, 33 can also connect to the other connector. In this way it becomes easy to insert a connection block 30 into an existing installation in order, temporarily, to benefit from dialogue facilities 35. In fact, in an installation in which internal connector 13 of housing 10 of a detector is initially connected directly to an external cable, the operation consists of disconnecting the external cable from internal connector 13, and then connecting a connection block 30 onto internal connector 13, and finally to reconnect the external cable onto external connector 33 of connection block 30. As the link cable 20 and external connector 33 of connection block 30 convey output signal 15, the operation of the detector can then continue normally. This operation has the simple effect of inserting the dialogue facilities 35 of a connection block 30 between the detector and the external cable, in such a way as temporarily to carry out parameter setting functions on the detector. By performing the operation in reverse, it is easy to revert to the initial connection, removable connection block 30 then becoming available again, for example to set the parameters of other detectors. This variant therefore makes it possible to economise on the number of connection blocks used. It also makes it possible to ensure that no modification to detector parameter settings takes place inadvertently.

Thus, in the case where there is an internal connector 13 on housing 10, this internal connector 13 is adapted in order that it can connect either with an external cable so that it delivers output signal 15, or with a link cable 20 so that it delivers output signal 15 and dialogue signals 14. Advantageously, a type M12 connector makes it possible to render all of these signals available on the same connector, use of any particular signal being then solely a function of the connections present on the mating connector present on the external cable and link cable 20, that has just been connected to internal connector 13.

It is clearly understood that, without departing from the scope of the invention, it is possible to conceive of other variants and detail improvements and even to consider the use of equivalent facilities.

What is claimed is:

1. An apparatus for detecting the proximity of a target comprising:
   a housing, said housing containing a proximity detector configured to provide an output signal communicating a position of said target in front of said housing, said proximity detector configured to receive input parameters and adjust operation of said proximity detector based on said input parameters;
   a connection block configured to communicate said input parameters to said proximity detector, said connection block separate from said housing; and
   a cable having a first end and a second end, said first end removably connected to said housing and said second end connected to said connection block, said cable configured to convey said output signal and said input parameters.

2. The apparatus recited in claim 1, wherein said connection block further comprises a first connector configured to communicate said output signal.

3. The apparatus recited in claim 2, wherein said housing further comprises a second connector configured to removably receive said first end of said cable.

4. The apparatus recited in claim 3, wherein said first connector and said second connector are of a same type.

5. The apparatus recited in any of claims 1 to 4, wherein said connection block further comprises an input element configured to communicate said input parameters to said proximity detector and an output element configured to display said output signal.

6. The apparatus recited in claim 5, wherein said input element comprises a pushbutton and said output element comprises a light emitting diode (LED).

7. The apparatus recited in claim 1, wherein said second end of said cable is molded onto said connection block.

8. The apparatus recited claim 1, wherein said proximity detector comprises an inductive proximity detector.

9. The apparatus recited claim 1, wherein said proximity detector comprises a capacitive proximity detector.

10. The apparatus recited in claim 1, wherein said proximity detector comprises a magnetic proximity detector.

11. The apparatus recited claim 1, wherein said proximity detector comprises a photoelectric cell proximity detector.

12. An apparatus for detecting the proximity of a target comprising:
  a housing, said housing containing a proximity detector configured to provide an output signal communicating a frequency of passage of said target in front of said housing, said proximity detector configured to receive input parameters and adjust operation of said proximity detector based on said input parameters;
  a connection block configured to communicate said input parameters to said proximity detector, said connection block separate from said housing; and
  a cable having a first end and a second end, said first end removably connected to said housing and said second end connected to said connection block, said cable configured to convey said output signal and said input parameters.

13. The apparatus recited in claim 12, wherein said connection block further comprises a first connector configured to communicate said output signal.

14. The apparatus recited in claim 13, wherein said housing further comprises a second connector configured to removably receive said first end of said cable.

15. The apparatus recited in claim 14, wherein said first connector and said second connector are of a same type.

16. The apparatus recited in any of claims 12 to 15, wherein said connection block further comprises an input element configured to communicate said input parameters to said proximity detector and an output element configured to display said output signal.

17. The apparatus recited in claim 16, wherein said input element comprises a pushbutton and said output element comprises a light emitting diode (LED).

18. The apparatus recited in claim 12, wherein said second end of said cable is molded onto said connection block.

19. The apparatus recited claim 12, wherein said proximity detector comprises an inductive proximity detector.

20. The apparatus recited claim 12, wherein said proximity detector comprises a capacitive proximity detector.

21. The apparatus recited claim 12, wherein said proximity detector comprises a magnetic proximity detector.

22. The apparatus recited claim 12, wherein said proximity detector comprises a photoelectric cell proximity detector.

23. An apparatus for detecting the proximity of a target comprising:
  a housing, said housing containing a detector configured to provide an output signal communicating a position of said target in front of said housing or a frequency of passage of said target in front of said housing, said proximity detector configured to receive input parameters and adjust operation of said proximity detector based on said input parameters; and
  input means configured to communicate said input parameters to said proximity detector, said input means separate from said housing;
  output means configured to display said output signal; and
  a cable having a first end and a second end, said first end removably connected to said housing and said second end connected to said input means, said cable configured to convey said output signal and said input parameters.

24. The apparatus recited in claim 23, wherein said input means comprises a pushbutton and said output means comprises a light emitting diode (LED).

* * * * *